(12) United States Patent
Hunton

(10) Patent No.: US 7,349,490 B2
(45) Date of Patent: Mar. 25, 2008

(54) ADDITIVE DIGITAL PREDISTORTION SYSTEM EMPLOYING PARALLEL PATH COORDINATE CONVERSION

(75) Inventor: Matthew J. Hunton, Liberty Lake, WA (US)

(73) Assignee: Powerwave Technologies, Inc., Santa Ana, CA (US)

(*) Notice: Subject to any disclaimer, the term of this patent is extended or adjusted under 35 U.S.C. 154(b) by 575 days.

(21) Appl. No.: 10/818,547

(22) Filed: Apr. 5, 2004

(65) Prior Publication Data

US 2004/0208259 A1    Oct. 21, 2004

Related U.S. Application Data

(60) Provisional application No. 60/463,228, filed on Apr. 16, 2003.

(51) Int. Cl.
    *H04L 25/03* (2006.01)
(52) U.S. Cl. .................................................... 375/296
(58) Field of Classification Search ................ 375/296, 375/295, 259, 377; 398/193; 455/114.3; 348/445; 708/442
    See application file for complete search history.

(56) References Cited

U.S. PATENT DOCUMENTS 4,700,151 A    10/1987    Nagata
5,404,378 A    4/1995     Kimura
5,524,286 A    6/1996     Chiesa et al.
5,870,668 A    2/1999     Takano et al.
7,139,327 B2 * 11/2006    Vella-Coleiro et al. ...... 375/296
2003/0179830 A1 * 9/2003  Eidson et al. ................ 375/296

FOREIGN PATENT DOCUMENTS

GB    2239770 A    7/1991

* cited by examiner

*Primary Examiner*—Sam K. Ahn
(74) *Attorney, Agent, or Firm*—Myers Dawes Andras & Sherman LLP

(57) ABSTRACT

A digital predistortion system and method employing parallel signal paths is disclosed. A first primary signal path receives a rectangular (I,Q) input signal and provides it to an additive predistortion correction circuit. A second parallel signal path includes coordinate rotation circuitry and a predistortion coefficient look up table. Any effects of calculational errors on the primary input signal are minimized by avoiding manipulations of the input signal in the primary signal path. A third parallel signal path may be used to receive the input signal for calculating adaptive updates to the look up table entries.

29 Claims, 3 Drawing Sheets

ADDITIVE DIGITAL PREDISTORTION SYSTEM EMPLOYING PARALLEL PATH COORDINATE CONVERSION

RELATED APPLICATION INFORMATION

The present application claims the benefit under 35 USC 119(e) of provisional application Ser. No. 60/463,228, filed Apr. 16, 2003, the disclosure of which is incorporated by reference in its entirety.

BACKGROUND OF THE INVENTION

1. Field of the Invention

This invention relates to the field of wireless communication systems. In particular, the invention relates to systems and methods for linearizing power amplifiers using digital predistortion.

2. Description of the Prior Art and Related Background Information

In modern wireless communication systems, complex signals are created in a digital format, converted into a baseband or analog signal, modulated onto an RF carrier, and amplified prior to signal transmission. The complex signals involved include both amplitude and phase modulation components. When signals vary in amplitude, the data conversion, modulation, and RF amplification circuits must be linear to maintain spectrum emissions within government-regulated compliance. The linearity of practical circuits however is limited particularly if these circuits are driven near operating limits. To maintain reasonable system cost and operating efficiency, operating components near operating limits is desired. One method of providing adequate system linearity and efficiency while operating near component limits is to provide signal predistortion prior to signal conversion, modulation, and amplification. Predistortion modifies the source signal to remove the non-linear effects of signal conversion, modulation, and amplification.

In most conventional predistortion circuits, instantaneous predistortion corrections are multiplied onto the source waveform. In such an approach, instantaneous predistortion corrections are determined by calculating the inverse instantaneous gain from the predistorter input to the amplifier output. This inverse gain is calculated by taking the ratio of the predistorter input divided by the amplifier output. The instantaneous predistortion corrections calculated in this manner are then multiplied onto the desired signal. Errors in the measurement and calculation of predistortion corrections are therefore multiplied onto the desired signal. The impact of signal measurement and calculation errors on the input signal can be quite significant and can actually degrade the signal quality, rather than improving it, in some cases.

In particular, the errors introduced in the above mentioned approach can be significant when the source signal or the output signal become very small or cross through zero. If the output signal crosses through zero or becomes very small, and the input signal does not, predistortion corrections will be based on infinite or very large gain calculations. If the input signal crosses through zero or becomes very small, and the output signal does not, predistortion corrections will be based on very small or zero gain calculations. Neither of these large or small gain calculations is real. Instantaneous predistortion calculations based on these values will be incorrect.

An additional but similar problem with the conventional approach is that all practical amplifiers have memory. This means that, after compensating for the delay of the amplifier, the output signal almost never crosses through zero at the same time as the input signal. Even if no errors existed in input and output signal measurements, amplifier memory effects may cause very large and very small gain calculations to be made when either the input or output signals become small. Also, generally speaking any calculational technique used in a digital predistortion system has inherent limitations in accuracy due to the finite signal quantization and the finite calculational capabilities of the calculation circuitry or processor used in the specific implementation. Ideally, these errors should affect the signal as little as possible without taking away the ability to provide the needed degree of predistortion.

Accordingly, a need presently exists for a digital predistortion system and method which avoids the above noted disadvantages of the prior art.

SUMMARY OF THE INVENTION

In a first aspect the present invention provides a digital predistortion circuit comprising an input for receiving a digital signal in rectangular coordinates, the digital signal having an in-phase component and a quadrature component. A first signal path is coupled to the input and includes in phase and quadrature predistortion correction addition circuits. The first signal path provides the input signal to the predistortion correction addition circuits in rectangular coordinates. A second signal path, in parallel to the first signal path, is coupled to the input and to the predistortion correction addition circuits. The second signal path includes a rectangular to polar coordinate conversion circuit converting the in phase and quadrature input signal to magnitude and phase components, and a predistortion correction circuit having an input receiving the magnitude of the input signal and outputting a predistortion correction signal. The second signal path provides in phase and quadrature predistortion correction values corresponding to the predistortion correction signal to the predistortion correction addition circuits in the first signal path. The predistortion correction addition circuits add the correction values to the input signal and output predistorted in phase and quadrature signals.

In a preferred embodiment the predistortion correction circuit comprises a look up table which outputs a polar coordinate predistortion correction signal having a magnitude correction component and a first phase correction component. The second signal path preferably further comprises a phase correction circuit, which combines the phase component of the input signal and the first phase correction component to provide an adjusted phase correction component, and a polar to rectangular coordinate conversion circuit which receives the magnitude correction component and adjusted phase correction component and outputs in phase and quadrature predistortion correction values. The phase correction circuit preferably comprises an addition circuit which adds the phase component of the input signal and the first phase correction component. The first signal path preferably also includes in phase and quadrature delay circuits coupled between the input and the predistortion correction addition circuits. The rectangular to polar coordinate conversion circuit and the polar to rectangular coordinate conversion circuit may preferably comprise a CORDIC (COordinate Rotation Digital Computer) circuit. The digital predistortion circuit may also include a third signal path, coupled in parallel to the first and second signal paths. The third signal path comprises a predistortion correction calculation circuit for calculating updates to the look up table. The predistortion correction calculation circuit is coupled to the input, the predistortion correction look up table, and to the output of the rectangular to polar coordinate conversion circuit. The third signal path also preferably includes in phase and quadrature delay circuits coupled between the input and the predistortion correction calculation circuit and magnitude and phase signal delay circuits coupled between the output of the rectangular to polar coordinate conversion circuit and the predistortion correction calculation circuit.

According to another aspect the present invention provides a linearized power amplifier system comprising an input receiving a digital input communication signal in rectangular coordinates. A main predistortion signal path is coupled to the input and includes a rectangular coordinate predistortion circuit providing a predistorted signal in rectangular coordinates. A parallel predistortion signal path is coupled to the input and comprises a rectangular coordinate to polar coordinate conversion circuit converting the input signal to a magnitude and phase component. A predistortion correction circuit is coupled to the rectangular coordinate to polar coordinate conversion circuit and outputs a predistortion correction in polar coordinates in response to the magnitude component. A phase adjuster receives the phase component of the input signal and adjusts the phase component of the predistortion correction, and a polar to rectangular conversion circuit receives the adjusted predistortion correction in polar coordinates and outputs a predistortion correction in rectangular coordinates to the rectangular coordinate predistortion circuit in the main predistortion signal path. A digital to analog converter circuit, coupled to the main predistortion signal path, receives the predistorted signal and outputs a predistorted analog signal. A modulator receives the predistorted analog signal and provides a corresponding RF signal. A power amplifier receives and amplifies the RF signal and provides an amplified RF output signal.

In a preferred embodiment of the linearized power amplifier system, the predistortion correction circuit comprises a look up table storing magnitude and phase predistortion correction values. The rectangular coordinate predistortion circuit preferably comprises an in phase addition circuit and a quadrature addition circuit for adding respective in phase and quadrature predistortion correction values to the input signal. The linearized power amplifier system may further comprise an output sampling coupler sampling the RF output signal, a demodulator circuit coupled to the output sampling coupler and providing a down converted sampled output signal, and an analog to digital converter coupled to the demodulator and providing a digital sampled output signal. A predistortion correction calculator is coupled to the input and to the analog to digital converter and calculates new predistortion correction values and writes them into the look up table. A delay circuit is provided between the input and the predistortion correction calculator. The predistortion correction calculator preferably comprises a subtraction circuit for determining the difference between the digital sampled output signal and the delayed input signal and providing in phase and quadrature error signals. A second rectangular coordinate to polar coordinate conversion circuit is coupled to the subtraction circuit and converts the in phase and quadrature error signals to magnitude and phase error signals. The predistortion correction calculator is coupled to the output of the rectangular coordinate to polar coordinate conversion circuit in the parallel predistortion signal path and adjusts the phase of the phase error signals using the phase component of the input signal. A second polar coordinate to rectangular coordinate conversion circuit receives the magnitude error signal and adjusted phase error signals and converts them to instantaneous in phase and quadrature correction values. An indexing and averaging circuit may be employed for indexing the instantaneous in phase and quadrature correction values to the magnitude of the input signal and averaging plural of the indexed in phase and quadrature correction values. A third rectangular coordinate to polar coordinate conversion circuit is coupled to the indexing and averaging circuit for outputting updated magnitude and phase predistortion correction values to the look up table.

According to another aspect the present invention provides a method for linearizing a digital input communication signal. The method comprises receiving a digital input communication signal in rectangular coordinates, splitting the input communication signal into parallel first and second signal paths, and converting the input communication signal in the second signal path from rectangular to polar coordinates, the polar coordinate signal including a magnitude and a phase component. The method further comprises determining a polar coordinates predistortion correction using the magnitude component of the input signal. The polar coordinates predistortion correction is converted to a rectangular coordinates predistortion correction and the rectangular coordinates predistortion correction is provided to the first signal path. The input signal in the first signal path is then predistorted using the rectangular coordinates predistortion correction.

In a preferred embodiment of the method for linearizing a digital input communication signal, the predistorting of the input signal comprises adding the rectangular coordinates predistortion correction to the input signal. More specifically, the in phase and quadrature components of the input signal and predistortion correction are added together separately. The method preferably further comprises adjusting the phase of the phase component of the polar coordinates predistortion correction using the phase component of the input signal. More specifically, adjusting the phase of the phase component may comprise adding the phase component of the input signal to the phase component of the polar coordinates predistortion correction. The method may also further comprise splitting the input signal on a third parallel signal path and calculating correction value updates using the input signal on the third signal path. Converting the input communication signal in the second signal path from rectangular to polar coordinates preferably comprises using the CORDIC algorithm. Similarly, converting the polar coordinates predistortion correction to a rectangular coordinates predistortion correction also preferably comprises using the CORDIC algorithm. Determining a polar coordinates predistortion correction using the magnitude component of the input signal may comprise accessing a predistortion correction value from a look up table using the magnitude component of the input signal as an address.

Further features and aspects of the present invention will be appreciated by review of the following detailed description of the invention.

DETAILED DESCRIPTION OF THE INVENTION

Figure 1:
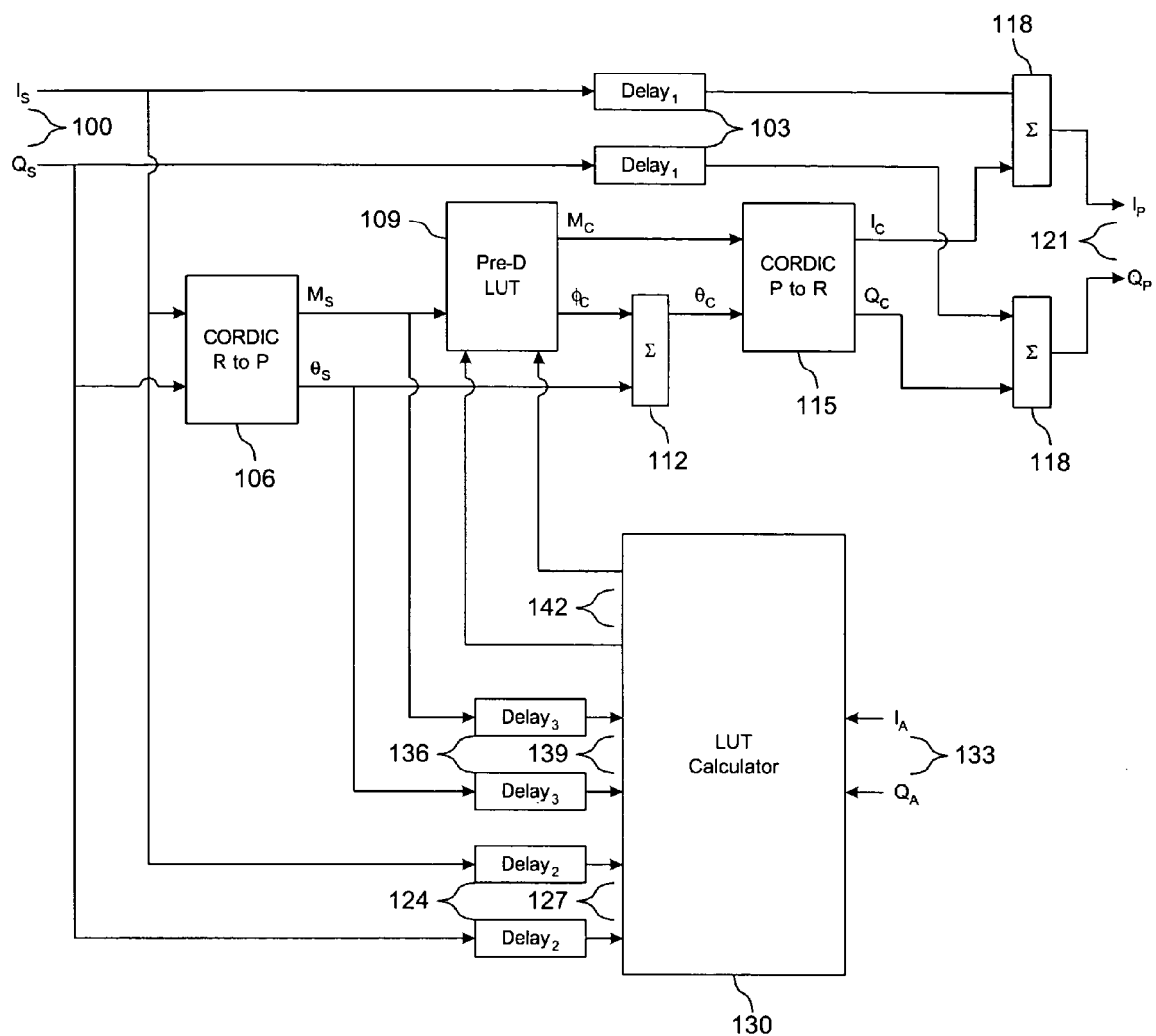
FIG. 1 is a block diagram of a digital predistortion system in accordance with a preferred embodiment of the present invention.

FIG. 1 shows a block diagram of the digital predistortion system of the present invention in accordance with a preferred embodiment. The digital predistortion system of the present invention receives and predistorts a digital input signal (100) to correct for nonlinearities in a subsequent transmission path. The predistorted signal (121) is then provided as an output. A specific embodiment of the digital predistortion system as part of a linearized power amplifier will be described below in relation to FIG. 2.

As shown in FIG. 1, the input signal (100) is coupled to three parallel signal paths. The first signal path is direct from input (100) to output (121) providing only a delay. The input signal will typically be provided as an in phase and quadrature (I,Q) signal, i.e., in rectangular coordinate form, and the entire first signal path is in such rectangular coordinates. The delay circuits (103) of this path compensate for the computation time required for determining the amount of predistortion to be added at predistortion correction circuit (118). This first signal path has no predistortion calculation circuitry, coordinate conversion circuitry, or other circuitry which could introduce errors into the signal due to calculational errors. The primary component of the output signal (121) is the undistorted source input signal (100) to which is added a predistortion correction at predistortion correction circuit (118). Predistortion correction circuit (118) comprises in phase and quadrature addition circuits. (As used herein, "addition" also includes subtraction as the sign of the correction may simply be reversed.) Since predistortion correction values added to the input signal will typically be relatively small, the impact of any errors in computing such correction values will be minimal.

The second signal path determines the predistortion correction added to the source input signal. The second signal path first converts the input signal from rectangular coordinates to polar coordinates using rectangular to polar coordinate converter circuit (106). The present invention shown in FIGS. 1, 2 and 3, includes several computation blocks for converting signal coordinates from rectangular-to-polar or from polar-to-rectangular (106, 115, 309, 315, 324, 406, 509, 515, 533, & 536). Each of these blocks indicates the use of a CORDIC (COordinate Rotation Digital Computer) algorithm. The CORDIC algorithm is well known to those skilled in the art as a highly efficient computational method for coordinate conversion. This is particularly true when hardware for a complex multiplication operation is not available. Use of the CORDIC algorithm is particularly advantageous if the present invention is implemented in a Field Programmable Gate Array (FPGA) or in an Application Specific Integrated Circuit (ASIC). The present invention will also function, however, using other coordinate transformation methods in some or all of the locations shown in these figures (106, 115, 309, 315, 324, 406, 509, 515, 533, & 536). The output of coordinate converter 106 includes a magnitude component, which is used by a predistortion correction circuit to generate predistortion correction values in polar coordinates, and a phase component which is used for phase alignment of the correction values. Preferably the predistortion correction circuit is implemented as a look up table (LUT) 109, however other implementations of the predistortion correction circuit may also be employed. More specifically, the output of the rectangular to polar coordinate converter (106) is a magnitude signal ($M_S$) and a phase signal ($\theta_S$) The magnitude output ($M_S$) of the rectangular to polar coordinate converter (106) is quantized to fixed steps. These fixed step $M_S$ values are used to address the memory location index of predistortion correction look up table (109) of additive predistortion correction values in polar coordinates. The look up table phase component $\phi_C$ is then added to the phase component $\theta_S$ of the input signal at addition circuit (112). This phase addition at (112) rotates the phase of the complex predistortion value to an adjusted phase correction value $\theta_C$ in proper alignment with the source input signal. The phase corrected instantaneous polar predistortion correction value ($M_C$, $\theta_C$) is then converted to rectangular coordinates at polar to rectangular coordinate converter (115). The rectangular coordinate (in phase and quadrature) predistortion correction values ($I_C$, $Q_C$) are then added to the source input signal at predistortion correction circuit (118). The predistorted rectangular coordinate signal is then output (121) to the transmission path requiring predistortion linearization.

Figure 2:
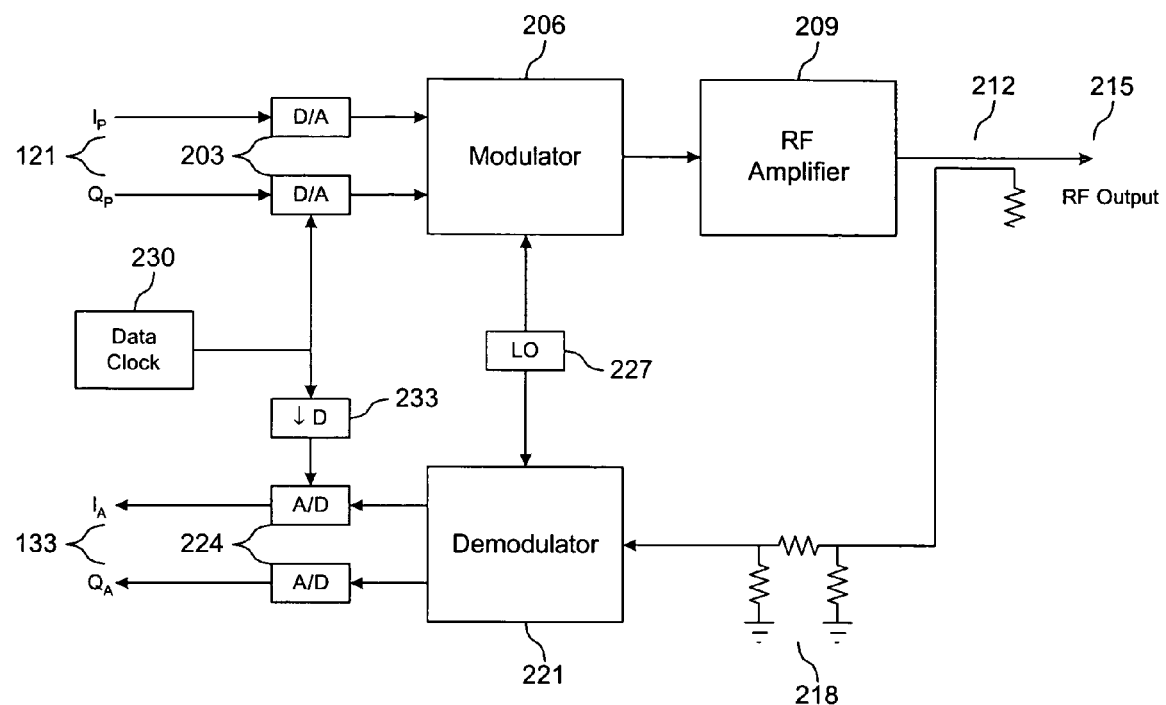
FIG. 2 is a block diagram of a digital input to RF output amplifier including a digitally sampled feedback path.

The third signal path is employed for adaptive updates of the look up table (109). More specifically, the input (100) is provided along the third signal path to LUT predistortion correction calculator (130) after applying a signal delay using I and Q delay circuits (124). The delay circuits (124) must be matched to that of the direct path delay circuits (103), predistortion addition circuits (118), and signal amplification and feedback paths (shown in FIG. 2). The source input signal is also provided to the LUT calculator (130) in polar coordinates (139). A delay circuit (136) matches the arrival time of the polar coordinate signal (139) to that for the rectangular coordinate signal (127) at the inputs to the predistortion correction calculator (130). The predistortion correction calculator computes new look up table values (142) based on past look up table values (109), the input signal (127 & 139), and feedback from the amplifier (133; FIG. 2). The operation of the predistortion correction calculator (130) will be described in detail below in relation to FIG. 3, after a discussion of the adaptive feedback path from the power amplifier shown in FIG. 2.

FIG. 2 is a block schematic drawing of a power amplifier receiving a predistorted digital input signal (121) provided by the predistortion system of FIG. 1. The power amplifier will introduce nonlinearities in amplifying the input signal which are corrected by the predistortion system of FIG. 1. The combination of the digital predistortion system of FIG. 1 and the power amplifier of FIG. 2 together comprise a linearized power amplifier system having a digital input and analog RF output.

Referring to FIG. 2, the predistorted signal (121) provided by the predistortion system of FIG. 1 is converted from digital to baseband by conventional digital to analog converters (203) and modulated to RF using a conventional modulator circuit (206). The RF signal is then amplified by a power amplifier (209) and output (215) from the system. Prior to signal output (215), the amplified signal is coupled via sampling coupler (212) into a feedback path. The sampled output is preferably attenuated by attenuator circuit (218) to remove system gain, and then demodulated to baseband by demodulator (221). The demodulated signal is sampled by analog to digital converters (224) for processing in the LUT calculator (130) (FIG. 1). The data clock (230) converts the input signal to baseband at the input signal data rate. (All of the circuitry of FIG. 1 preferably operates at this data clock rate.) This clock rate must be fast enough to meet Nyquist requirements for the bandwidth of the added predistortion signal (118 in FIG. 1). This bandwidth will typically be 4 to 7 times the input signal (100) bandwidth depending on the non-linear characteristics of the digital to analog conversion circuitry (203), modulation circuitry (206) and RF power amplifier (209). The amplifier feedback (133) data rate is preferably operated at a slower rate than the input signal to reduce D/A conversion costs and improve sampling linearity. The clock rate down converter (233) reduces the signal rate 'D' times. The baseband to RF modulator (206) and RF to baseband demodulator (221) preferably both operate from a common local oscillator (227). This removes phase and frequency drift of the local oscillator (227) from corrupting predistortion look up table calculations. Those skilled in the art will appreciate that other modulation, demodulation, and sampling methods can be used to achieve similar results.

Figure 3:
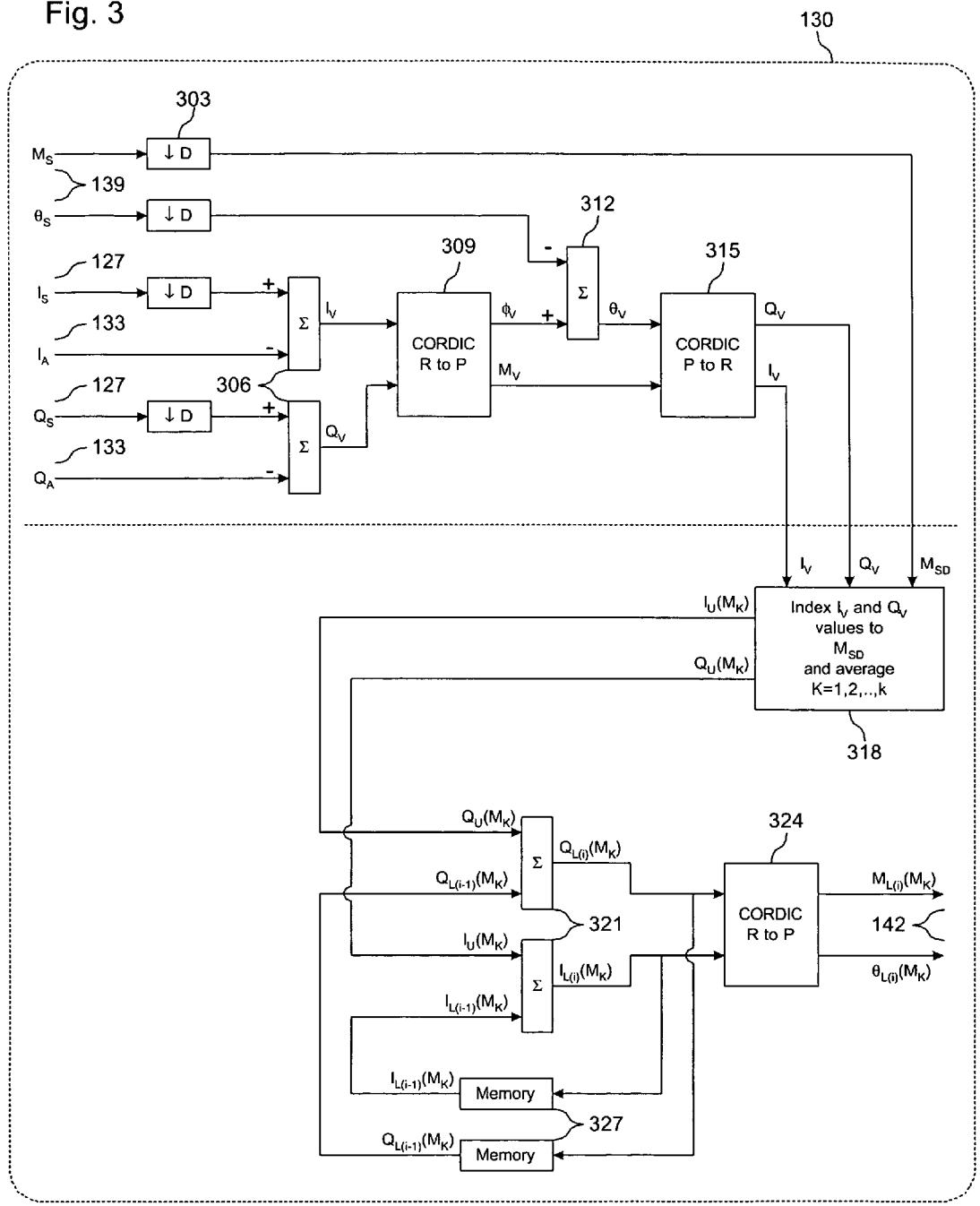
FIG. 3 is a block diagram of a predistortion correction calculator used in conjunction with the embodiment of FIG. 1.

FIG. 3 shows a block diagram of a preferred implementation of predistortion correction calculator (130). When predistortion first begins, all look up table (109) entries are preferably filled with zero magnitude and zero phase predistortion values. Therefore, when predistortion first begins, no correction is applied to the input signal during output predistortion combination (118). Look up table updates are calculated by first taking the source signal (127) and down sampling to the same data rate as the amplifier feedback signal (133). This down sampling is performed by conventional down sampling circuits (303) on both the rectangular (127) and polar (139) versions of the source signal. Once the source and amplifier feedback sample rates are matched, a difference is taken at addition circuits (306) between the source signal (127) and the feedback signal (133) in rectangular coordinates. The resulting difference is then converted from rectangular to polar coordinates using rectangular to polar coordinate converter (309). This conversion is followed by subtracting, at addition circuits (312), the instantaneous phase of the source input signal (139). This phase adjustment normalizes the phase correction values to a common reference, e.g. to zero phase. With the source signal instantaneous phase removed at (312), the difference signals are converted back to rectangular coordinates by polar to rectangular coordinate converter (315). (This conversion is employed to facilitate averaging of plural correction values, as described below, but may be dispensed with in some implementations. In such an alternative implementation, coordinate converter 324 would also be unnecessary.) The rectangular coordinate difference signals are then indexed to the down sampled magnitude $M_S$ of the source signal (139), and the indexed values are averaged together by indexing and averaging circuit (318). This indexing and averaging operation averages together correction values that have identical or near identical source magnitudes $M_S$ (139). Generally, corrections within incrementally increasing source magnitude ranges will be averaged together to reduce the number of look up table values required. With the indexing and averaging performed, the look up table updates are added to the past look-up-table values that have been stored in memory (327) at I,Q addition circuits (321). The memory (327) holds the same data as look up table (109) but in rectangular coordinates. As with the initial entries of look up table (109) of FIG. 1, these memory values in memory (327) are initially zero valued. After addition at (321), the new look up table predistortion correction values are stored in rectangular coordinates in memory (327) and converted to polar coordinates by rectangular to polar coordinate converter (324). The updated polar coordinate predistortion correction values are then written to the look up table (109) shown in FIG. 1. Once the initial zero valued entries of the look up table have been replaced, the look up table updates need only be performed occasionally to account for system performance changes.

In view of the above, it will be appreciated that the predistortion system and method of the present invention provides a number of desirable features and advantages. The approach of the present invention minimizes any effects of errors in predistortion calculations, coordinate conversions, or other calculations or manipulations needed to predistort the input signal, on the input signal itself by performing all such calculations in a parallel signal path. Also, the approach of the present invention calculates instantaneous predistortion corrections based on amplifier output and predistortion input signal differences (rather than ratios). The relative distance of the output and input signal amplitudes to zero is irrelevant. Only the relative distance between the output and input signal is important. This greatly reduces the effect of measurement error and amplifier memory on predistorter performance. The present invention may also utilize the CORDIC (COordinate Rotation DIgital Computer) algorithm for converting complex signal values from rectangular to polar coordinates and from polar to rectangular coordinates. This algorithm is very computationally efficient in binary computers. The algorithm can be tailored for computation speed, accuracy, and available digital circuitry and memory. When configured properly, the CORDIC algorithm can remove all need for multiplication operations, relying only on shift and addition operations. Therefore, undue circuit complexity can be avoided. Additional features and advantages of the present invention will be appreciated by those skilled in the art.

It will be appreciated by those skilled in the art that various modifications of the above detailed implementation may be employed. Accordingly, the specific illustrated embodiment is not meant to be limiting in nature and the present invention covers all those specific implementations too numerous to describe in detail.

What is claimed is:

1. A digital predistortion circuit, comprising:
   an input for receiving a digital input signal in rectangular coordinates having an in-phase component and a quadrature component;
   a first signal path coupled to the input and including in phase and quadrature predistortion correction addition circuits, said first signal path providing the input signal to the predistortion correction addition circuits in rectangular coordinates; and
   a second signal path, coupled in parallel to said first signal path and coupled to the input and to the predistortion correction addition circuits, the second signal path including a rectangular to polar coordinate conversion circuit converting the in phase and quadrature input signal to magnitude and phase components, and a predistortion correction circuit having an input receiving the magnitude of the input signal and outputting a predistortion correction signal;
   wherein the second signal path provides in phase and quadrature predistortion correction values corresponding to the predistortion correction signal to the predistortion correction addition circuits in the first signal path and the predistortion correction addition circuits add the correction values to the input signal and output predistorted in phase and quadrature signals.

2. A digital predistortion circuit as set out in claim 1, wherein the predistortion correction circuit comprises a look up table which outputs a polar coordinate predistortion correction signal having a magnitude correction component and a first phase correction component, and wherein the second signal path further comprises a phase correction circuit combining the phase component of the input signal and the first phase correction component to provide an adjusted phase correction component, and a polar to rectangular coordinate conversion circuit receiving the magnitude correction component and the adjusted phase correction component and outputting in phase and quadrature predistortion correction values.

3. A digital predistortion circuit as set out in claim 1, wherein said first signal path further comprises in phase and quadrature delay circuits coupled between the input and the predistortion correction addition circuits.

4. A digital predistortion circuit as set out in claim 1, wherein said rectangular to polar coordinate conversion circuit comprises a Coordinate Rotation Digital Computer (CORDIC) circuit.

5. A digital predistortion circuit as set out in claim 2, wherein said polar to rectangular coordinate conversion circuit comprises a Coordinate Rotation Digital Computer (CORDIC) circuit.

6. A digital predistortion circuit as set out in claim 2, further comprising a third signal path, coupled in parallel to the first and second signal paths and coupled to the input and to the predistortion correction look up table, said third signal path comprising a predistortion correction calculation circuit for calculating updates to the look up table.

7. A digital predistortion circuit as set out in claim 6, wherein said predistortion correction calculation circuit is coupled to the output of said rectangular to polar coordinate conversion circuit.

8. A digital predistortion circuit as set out in claim 6, wherein said third signal path further comprises in phase and quadrature delay circuits coupled between the input and the predistortion correction calculation circuit.

9. A digital predistortion circuit as set out in claim 7, wherein said third signal path further comprises magnitude and phase signal delay circuits coupled between the output of said rectangular to polar coordinate conversion circuit and the predistortion correction calculation circuit.

10. A digital predistortion circuit as set out in claim 2, wherein said phase correction circuit comprises an addition circuit which adds the phase component of the input signal and the first phase correction component.

11. A linearized power amplifier system, comprising:

an input receiving a digital input communication signal in rectangular coordinates;

a main predistortion signal path, coupled to said input, including a rectangular coordinate predistortion circuit for adding a predistortion correction to said input communication signal and providing a predistorted signal in rectangular coordinates;

a parallel predistortion signal path, coupled to said input, comprising a rectangular coordinate to polar coordinate conversion circuit converting the input signal to a magnitude and phase component, a predistortion correction circuit coupled to the rectangular coordinate to polar coordinate conversion circuit and outputting a predistortion correction in polar coordinates in response to said magnitude component, a phase adjuster receiving the phase component of the input signal and adjusting the phase component of the predistortion correction, and a polar to rectangular conversion circuit receiving the adjusted predistortion correction in polar coordinates and outputting said predistortion correction in rectangular coordinates to said rectangular coordinate predistortion circuit in said main predistortion signal path;

a digital to analog converter circuit, coupled to the main predistortion signal path, receiving the predistorted signal and outputting a predistorted analog signal;

a modulator receiving the predistorted analog signal and providing a corresponding RF signal; and a power amplifier receiving and amplifying the RF signal and providing an RF output signal.

12. A linearized power amplifier system as set out in claim 11, wherein said predistortion correction circuit comprises a look up table storing magnitude and phase predistortion correction values.

13. A linearized power amplifier system as set out in claim 11, wherein said rectangular coordinate predistortion circuit comprises an in phase addition circuit and a quadrature addition circuit for adding respective in phase and quadrature predistortion correction values to said input signal.

14. A linearized power amplifier system as set out in claim 12, further comprising an output sampling coupler sampling the RF output signal, a demodulator circuit coupled to the output sampling coupler and providing a down converted sampled output signal, an analog to digital converter coupled to the demodulator and providing a digital sampled output signal, and a predistortion correction calculator coupled to the input and the analog to digital converter for calculating new predistortion correction values and writing them into the look up table.

15. A linearized power amplifier system as set out in claim 14, further comprising a delay circuit coupled between the input and said predistortion correction calculator.

16. A linearized power amplifier system as set out in claim 15, wherein said predistortion correction calculator comprises a subtraction circuit for determining the difference between said digital sampled output signal and the delayed input signal and providing in phase and quadrature error signals.

17. A linearized power amplifier system as set out in claim 16, wherein said predistortion correction calculator further comprises a second rectangular coordinate to polar coordinate conversion circuit coupled to said subtraction circuit for converting said in phase and quadrature error signals to magnitude and phase error signals.

18. A linearized power amplifier system as set out in claim 17, wherein said predistortion correction calculator is coupled to said rectangular coordinate to polar coordinate conversion circuit in said parallel predistortion signal path and adjusts the phase of said phase error signals using said phase component of the input signal.

19. A linearized power amplifier system as set out in claim 18, wherein said predistortion correction calculator further comprises a second polar coordinate to rectangular coordinate conversion circuit receiving and converting the magnitude error signal and adjusted phase error signals to instantaneous in phase and quadrature correction values.

20. A linearized power amplifier system as set out in claim 19, wherein said predistortion correction calculator further comprises an indexing and averaging circuit for indexing said instantaneous in phase and quadrature correction values to the magnitude of the input signal and averaging plural of said indexed in phase and quadrature correction values.

21. A linearized power amplifier system as set out in claim 20, wherein said predistortion correction calculator further comprises a third rectangular coordinate to polar coordinate conversion circuit coupled to said indexing and averaging circuit for outputting updated magnitude and phase predistortion correction values to said look up table.

22. A method for linearizing a digital input communication signal, comprising:

receiving a digital input communication signal in rectangular coordinates;

splitting the input communication signal into parallel first and second signal paths;

converting the input communication signal in the second signal path from rectangular to polar coordinates, including a magnitude and a phase component;

determining a polar coordinates predistortion correction using said magnitude component of the input signal;

converting the polar coordinates predistortion correction to a rectangular coordinates predistortion correction;

providing the rectangular coordinates predistortion correction to said first signal path; and predistorting the input signal in said first signal path using said rectangular coordinates predistortion correction, wherein said predistorting the input signal comprises adding the rectangular coordinates predistortion correction to the input signal.

23. A method for linearizing a digital input communication signal as set out in claim 22, wherein said input signal comprises an in phase and quadrature component and the rectangular coordinates predistortion correction comprises an in phase and quadrature component, and wherein said adding comprises separately adding the in phase and quadrature components of said input signal and said rectangular coordinates predistortion correction.

24. A method for linearizing a digital input communication signal as set out in claim 22, wherein said polar coordinates predistortion correction has a magnitude component and a phase component and wherein said method further comprises adjusting the phase of said phase component of the polar coordinates predistortion correction using the phase component of the input signal.

25. A method for linearizing a digital input communication signal as set out in claim 24, wherein adjusting the phase of said phase component comprises adding the phase component of the input signal to the phase component of the polar coordinates predistortion correction.

26. A method for linearizing a digital input communication signal as set out in claim 22, further comprising splitting said input signal on a third parallel signal path and calculating correction value updates using the input signal on said third signal path.

27. A method for linearizing a digital input communication signal as set out in claim 22, wherein said converting the input communication signal in the second signal path from rectangular to polar coordinates comprises using the Coordinate Rotation Digital Computer (CORDIC) algorithm.

28. A method for linearizing a digital input communication signal as set out in claim 22, wherein said converting the polar coordinates predistortion correction to a rectangular coordinates predistortion correction comprises using the Coordinate Rotation Digital (CORDIC) algorithm.

29. A method for linearizing a digital input communication signal as set out in claim 22, wherein said determining a polar coordinates predistortion correction using said magnitude component of the input signal comprises accessing a predistortion correction value from a look up table using said magnitude component of the input signal as an address.

* * * * *